US012666779B2

(12) United States Patent
Guo et al.

(10) Patent No.: US 12,666,779 B2
(45) Date of Patent: Jun. 23, 2026

(54) MICRO LED, MICRO LED PANEL AND MICRO LED CHIP

(71) Applicant: Hue Inc., Shanghai (CN)

(72) Inventors: Jian Guo, Shanghai (CN); Qiming Li, Shanghai (CN); Huiwen Xu, Shanghai (CN)

(73) Assignee: Hue Inc., Shanghai (CN)

( * ) Notice: Subject to any disclaimer, the term of this patent is extended or adjusted under 35 U.S.C. 154(b) by 544 days.

(21) Appl. No.: 18/116,405

(22) Filed: Mar. 2, 2023

(65) Prior Publication Data

US 2023/0282683 A1 Sep. 7, 2023

(30) Foreign Application Priority Data

Mar. 3, 2022 (WO) ................ PCT/CN2022/079086

(51) Int. Cl.
*H10H 29/14* (2025.01)
*H10H 20/819* (2025.01)
*H10H 20/811* (2025.01)

(52) U.S. Cl.
CPC ........ *H10H 29/142* (2025.01); *H10H 20/819* (2025.01); *H10H 20/811* (2025.01)

(58) Field of Classification Search
CPC .. H10H 29/142; H10H 20/819; H10H 20/811; H10H 20/821; H10H 20/831; H10H 20/812; H01L 25/0753; H01L 25/167
See application file for complete search history.

(56) References Cited

U.S. PATENT DOCUMENTS

| | | | | |
|---|---|---|---|---|
| 2011/0227033 A1* | 9/2011 | Kushibe | .............. | H10H 20/812 |
| | | | | 438/47 |
| 2016/0365337 A1* | 12/2016 | Chen | .................. | H10H 20/8585 |
| 2019/0355704 A1* | 11/2019 | Cheng | ................... | H01L 25/167 |
| 2021/0257521 A1* | 8/2021 | Wang | .................. | H10H 20/854 |
| 2022/0131036 A1* | 4/2022 | Lo | .......................... | H10H 20/819 |
| 2022/0319892 A1* | 10/2022 | Cho | ........................ | H10H 20/01 |
| 2023/0011141 A1* | 1/2023 | Lee | ........................ | H10H 20/854 |

FOREIGN PATENT DOCUMENTS

| | | | | |
|---|---|---|---|---|
| CN | 103579433 A | 2/2014 | | |
| CN | 108011012 A | 5/2018 | | |
| CN | 112289901 A | * 1/2021 | .......... | H10H 29/142 |

OTHER PUBLICATIONS

International Search Report and Written Opinion of International Application No. PCT/CN2022/079086 dated Nov. 25, 2022.

* cited by examiner

*Primary Examiner* — S M Sohel Imtiaz
(74) *Attorney, Agent, or Firm* — FINNEGAN, HENDERSON, FARABOW, GARRETT & DUNNER LLP

(57) ABSTRACT

A micro LED includes a first type semiconductor layer; a light emitting layer formed on the first type semiconductor layer; a second type semiconductor layer formed on the light emitting layer; wherein, at least one part of a sidewall of the second type semiconductor layer is not aligned with a sidewall of the first type semiconductor layer.

12 Claims, 4 Drawing Sheets

<u>200</u>

700

710

MICRO LED, MICRO LED PANEL AND MICRO LED CHIP

CROSS-REFERENCE TO RELATED APPLICATIONS

The disclosure claims the benefits of priority to PCT Application No. PCT/CN2022/079086, filed on Mar. 3, 2022, which is incorporated herein by reference in its entirety.

TECHNICAL FIELD

The present disclosure generally relates to light emitting diode, and more particularly, to a micro light emitting diode (LED), a micro LED panel, and a micro LED chip.

BACKGROUND

Micro pixel light emitting diodes, also referred to as micro light emitting diodes, micro LEDs or μ-LEDs, are of increasing importance because of their use in various applications including self-emissive micro-displays, visible light communications, and optogenetics. For display applications, micro LEDs based arrays have been demonstrated with pixel dimensions as small as 12 μm. The micro LEDs show higher output performance than conventional LEDs due to better strain relaxation, improved light extraction efficiency, and uniform current spreading. The micro LEDs also exhibit improved thermal effects and can be operated at higher current density compared with conventional LEDs.

However, the smaller LEDs pixel with higher current densities will experience red-shift, lower maximum efficiency, and inhomogeneous emission at the high current density, which has been attributed to fabrication process damage that results in degraded electrical injection. In addition, the peak external quantum efficiencies (EQEs) and internal quantum efficiency (IQE) are largely decreased with decreasing chip size. The decreased EQE is explained in terms of nonradiative recombination caused by etching damage and the decreased IQE is attributed to the poor current injection and electron leakage current of micro LEDs.

The above discussion is only provided to assist in understanding the technical solutions of the present disclosure, and does not constitute an admission that the above is prior art.

SUMMARY OF THE DISCLOSURE

Embodiments of the present disclosure provide a micro LED. The micro LED includes a first type semiconductor layer; a light emitting layer formed on the first type semiconductor layer; and a second type semiconductor layer formed on the light emitting layer; wherein, at least one part of sidewall of the second type semiconductor layer is not aligned with a sidewall of the first type semiconductor layer.

Embodiments of the present disclosure also provide a micro LED panel. The micro LED panel includes two or more above described micro LEDs, wherein the light emitting layer is continuous between adjacent micro LEDs.

Embodiments of the present disclosure also provide a micro LED chip. The micro LED panel includes one or more of the above described micro LED panels.

Additional advantages and features of the present disclosure will be further understood by the following detailed descriptions and the appended drawings.

BRIEF DESCRIPTION OF THE DRAWINGS

Embodiments and various aspects of the present disclosure are illustrated in the following detailed description and the accompanying figures. Various features shown in the figures are not drawn to scale.

DETAILED DESCRIPTION

Reference will now be made in detail to exemplary embodiments, examples of which are illustrated in the accompanying drawings. The following description refers to the accompanying drawings in which the same numbers in different drawings represent the same or similar elements unless otherwise represented. The implementations set forth in the following description of exemplary embodiments do not represent all implementations consistent with the disclosure. Instead, they are merely examples of apparatuses and methods consistent with aspects related to the invention as recited in the appended claims. Particular aspects of the present disclosure are described in greater detail below. The terms and definitions provided herein control, if in conflict with terms and/or definitions incorporated by reference.

In order to overcome the drawback mentioned above, the present disclosure provides a micro LED configured to minimize surface carrier loss and optimize quantum well sidewall area.

More particularly, the micro LED embodiments disclosed herein decreases a dimension of a second type semiconductor layer to prevent carriers spreading between adjacent LEDs and to form a continual quantum well effect at a sidewall of the quantum well to minimize surface carrier nonradiative recombination. Furthermore, an isolation structure formed between the adjacent LEDs can inhibit optical and electrical crosstalk. Additionally, a maximum width of a first electrode is less than a minimum width of a first type semiconductor layer so as to decrease a carrier spreading area.

Figure 1:
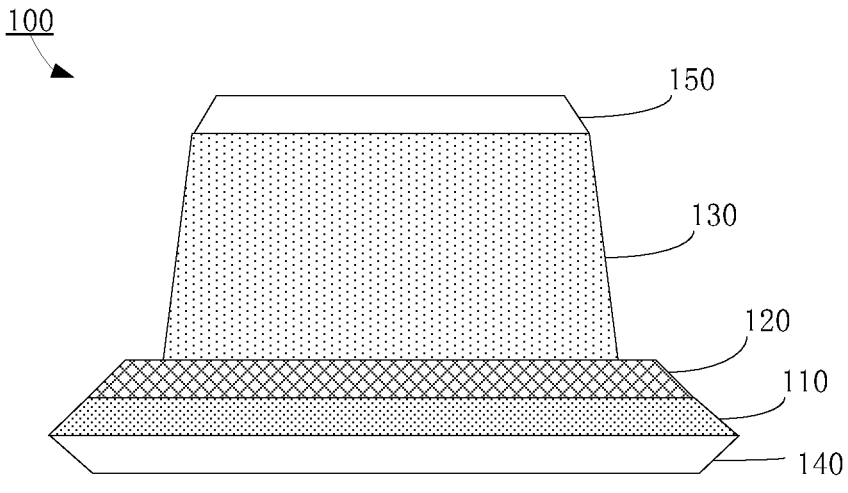
FIG. 1 is a structural diagram of a first exemplary micro LED according to some embodiments of the present disclosure.

FIG. 1 is a structural diagram showing a side sectional view of an exemplary micro LED 100 according to some embodiments of the present disclosure. Referring to FIG. 1, the micro LED 100 includes a first type semiconductor layer 110, a light emitting layer 120, and a second type semiconductor layer 130. The light emitting layer 120 is formed on the first type semiconductor layer 110, and the second type semiconductor layer 130 is formed on the light emitting layer 120. In the embodiment, a bottom width of the second type semiconductor layer 130 is less than a top width of the first type semiconductor layer 110. Therefore, at least one part of a sidewall of the second type semiconductor layer 130 is not aligned with a sidewall of the first type semiconductor layer 110. In some embodiments, a maximum width of the second type semiconductor layer 130 is less than the minimum width of the first type semiconductor layer 110. In some embodiments, as shown in FIG. 1, the width of the second type semiconductor layer 130 and the width of the first type semiconductor layer 110 are gradually increased from top to bottom. Therefore, the bottom width of the second type semiconductor layer 130 is less than the top width of the first type semiconductor layer 110. In this embodiment, the sidewall of the first type semiconductor layer 110 is not aligned with the sidewall of the second type semiconductor layer 130, but the sidewall of the second semiconductor layer 130 conforms to a straight line. The sidewall of the light emitting layer 120 exceeds the sidewall of the second type semiconductor layer 130 in a horizontal direction. In some embodiments, the sidewall of the first type semiconductor layer 110 is aligned with the sidewall of the light emitting layer 120.

In some embodiments, the micro LED 100 further includes a first electrode 140 and a second electrode 150. The first electrode 140 is formed at the bottom of the first type semiconductor layer 110, and the second electrode 150 formed at the top of the second type semiconductor layer 130. A minimum width of the first electrode 140 is the same as a maximum width of the light emitting layer 120, but is greater than a maximum width of the second electrode 150. With this structure, the emitting area can be ensured to be the largest, and the light emitting efficiency is improved.

In some embodiments, the first type semiconductor layer 110, the second type semiconductor layer 130, the light emitting layer 120, the first electrode 140 and the second electrode 150 can have different shapes, for example, truncated-cone-type, cylindrical or cubic, etc. Therefore, in some embodiments, as seen from the side sectional view of a structure of the micro LED 100, each of the first type semiconductor layer 110, the second type semiconductor layer 130, the light emitting layer 120, the first electrode 140 and the second electrode 150 can have the same width from top to bottom, respectively.

In some embodiments, the widths of the first type semiconductor layer 110 and the second type semiconductor layer 130 are gradually decreased from top to bottom, and the sidewall of the first type semiconductor layer 110 is not aligned with the sidewall of the second type semiconductor layer 130.

Figure 2:
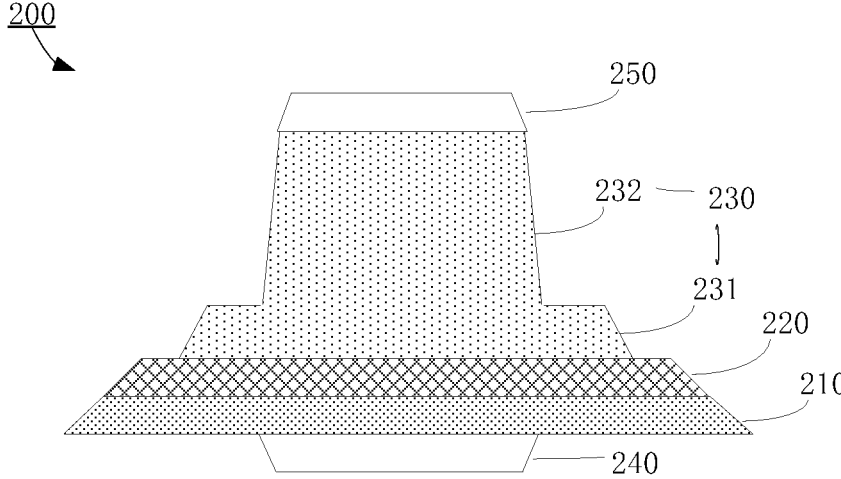
FIG. 2 is a structural diagram of a second exemplary micro LED according to some embodiments of the present disclosure.

FIG. 2 is a structural diagram showing a side sectional view of an exemplary micro LED 200 according to some embodiments of the present disclosure. Referring to FIG. 2, the micro LED 200 includes a second type semiconductor layer 230, in which a sidewall of the second type semiconductor layer 230 is not aligned. The sidewall of the second type semiconductor layer 230 includes one or more step structures 231 and 232. The sidewall of the second type semiconductor layer 230 does not conform to a straight line that is, the sidewall of step structure 231 and the sidewall of step structure 232 are not aligned. A bottom width of the second type semiconductor layer 230 (e.g., the bottom width of the step structure 231) is less than a top width of a first type semiconductor layer 210. A bottom width of the step structure 232 is less than a top width of the step structure 231. A maximum width of a second electrode 250 formed at a top of the step structure 232 is less than a minimum width of the second type semiconductor layer 230 (e.g., a top width of the step structure 232), and a maximum width of a first electrode 240 formed at a bottom of the first type semiconductor layer 210 is less than a minimum width of the first type semiconductor layer 210. In some embodiments, a thickness of the upper step structure 232 of the second type semiconductor layer 230 is greater than a thickness of the bottom step structure 231 of the second type semiconductor layer 230. In some embodiments, a maximum width of the first electrode 240 is less than or equal to a minimum width of the second electrode 250.

Figure 3:
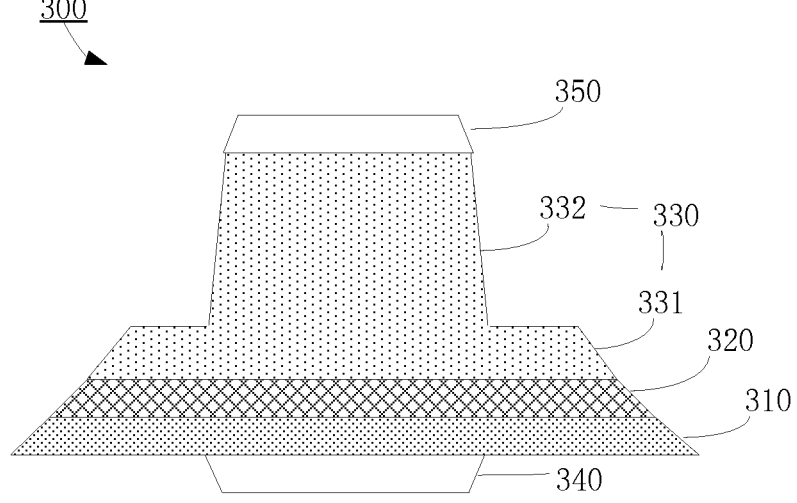
FIG. 3 is a structural diagram of a third exemplary micro LED according to some embodiments of the present disclosure.

FIG. 3 is a structural diagram showing a side sectional view of an exemplary micro LED 300 according to some embodiments of the present disclosure. Referring to FIG. 3, the micro LED 300 includes a second type semiconductor layer 330. The second type semiconductor layer 330 includes one or more step structures 331 and 332. A sidewall of the second type semiconductor layer 330 does not conform to a straight line, that is, the sidewall of step structure 331 and the sidewall of step structure 332 are not aligned. A bottom sidewall of the second type semiconductor layer 330 (e.g., the sidewall of the step structure 331) is aligned with the sidewall of the first type semiconductor layer 310. As shown in FIG. 3, the sidewall of the bottom step structure 331 is further aligned with a sidewall of a light emitting layer 320 between the first type semiconductor layer 310 and the second type semiconductor layer 330. A maximum width of a first electrode 340 formed at the bottom of a first type semiconductor layer 310 is less than or equal to a minimum width of a second electrode 350 formed at the top of the second type semiconductor layer 330.

When a micro LED chip includes one or more above described micro LEDs, the light emitting layer and the first type semiconductor layer are continuously formed on the whole micro LED chip. The minimum width of the second type semiconductor layer is less than the minimum width of the first type semiconductor layer and less than the minimum width of the first electrode for each micro LED. Furthermore, an isolation structure is formed between the adjacent micro LEDs to prevent the crosstalk between the adjacent LEDs.

Figure 4:
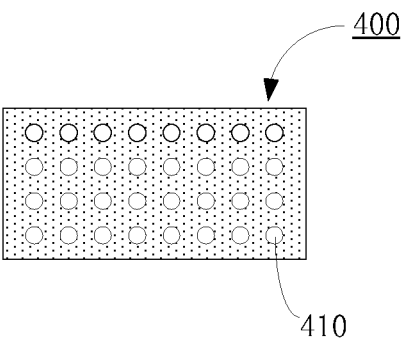
FIG. 4 is a structural diagram of an exemplary micro LED panel according to some embodiments of the present disclosure.
Figure 5:
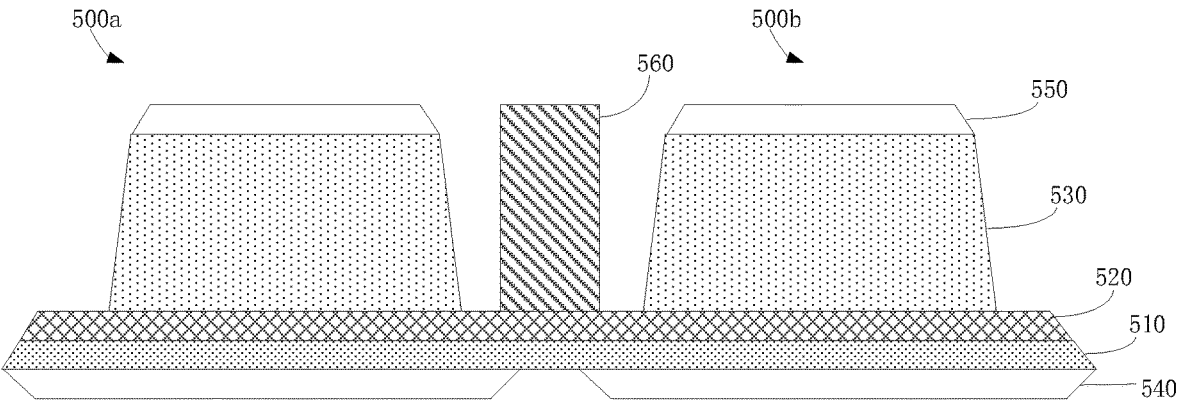
FIG. 5 is a structural diagram illustrating adjacent micro LEDs according to some embodiments of the present disclosure.

FIG. 4 is a structural diagram showing a plan view of an exemplary micro LED panel 400 according to some embodiments of the present disclosure. As shown in FIG. 4, the micro LED panel 400 includes two or more micro LEDs 410. The one or more micro LEDs 410 are arranged in an array on the micro LED panel 400. FIG. 5 is a structural diagram showing in a side sectional view of the micro LEDs, as exemplary adjacent micro LEDs 500a and 500b included in the micro LED panel 400, according to some embodiments of the present disclosure. The micro LEDs 500a and 500b may have the same structure as the micro LED 100 as shown in FIG. 1. Referring to FIG. 4 and FIG. 5, a light emitting layer 520 is continuous between adjacent micro LEDs 500a and 500b. A first type semiconductor layer 510 is also continuous between the adjacent micro LEDs 500a and 500b. The light emitting layer 520 and the first type semiconductor layer 510 are continuously formed on the whole micro LED panel. In some embodiments, a maximum width of a second type semiconductor layer 530 of each micro LED is less than a minimum width of a first electrode 540 for each micro LED. Each first electrode 540 is formed at the bottom of the first type semiconductor layer and generally aligned with a corresponding second type semiconductor layer 530. Furthermore, an isolation structure 560 is formed between the adjacent micro LEDs 500a and 500b to prevent crosstalk between the adjacent micro LEDs. As shown in FIG. 5, the isolation structure 560 is provided on the light emitting layer 520, and a top surface of the isolation structure 560 is equal to or higher than a top surface of the micro LEDs 500*a* and 500*b*, for example, a top surface of a second electrode 550 of each micro LED. Each second electrode 550 is formed at the top of a corresponding second type semiconductor layer 530.

Figure 6:
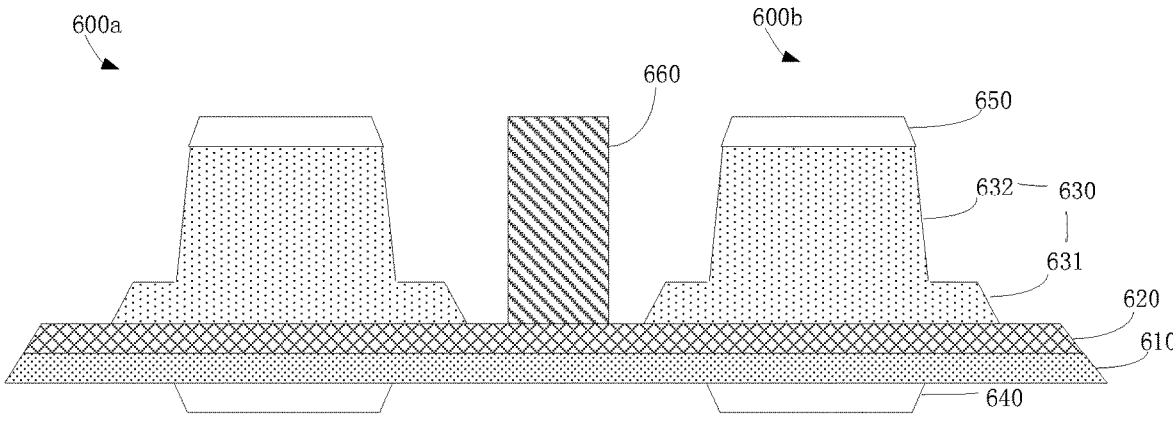
FIG. 6 is a structural diagram illustrating another adjacent micro LEDs according to some embodiments of the present disclosure.

FIG. 6 is a structural diagram showing in a side sectional view of the micro LEDs, as exemplary adjacent micro LEDs 600*a* and 600*b* included in the micro LED panel 400, according to some embodiments of the present disclosure. The micro LEDs 600*a* and 600*b* may have the same structure as the micro LED 200 as shown in FIG. 2. Referring to FIG. 4 and FIG. 6, a light emitting layer 620 is continuous between adjacent micro LEDs 600*a* and 600*b*. A first type semiconductor layer 610 is also continuous between the adjacent micro LEDs 600*a* and 600*b*. The light emitting layer 620 and the first type semiconductor layer 610 are continuously formed on the whole micro LED panel 400. A second type semiconductor layer 630 includes one or more step structures 631, 632. A sidewall of step structure 631 and a sidewall of step structure 632 are not aligned. Each first electrode 640 is formed at the bottom of the first type semiconductor layer 610 and generally aligned with a corresponding second type semiconductor layer 630. Each second electrode 650 is formed at the top of a corresponding second type semiconductor layer 630. In some embodiments, a maximum width of the first electrode 640 is less than or equal to a maximum width of the second electrode 650. Furthermore, an isolation structure 660 is formed between the adjacent micro LEDs 600*a* and 600*b* to prevent the crosstalk between the adjacent micro LEDs.

Figure 7:
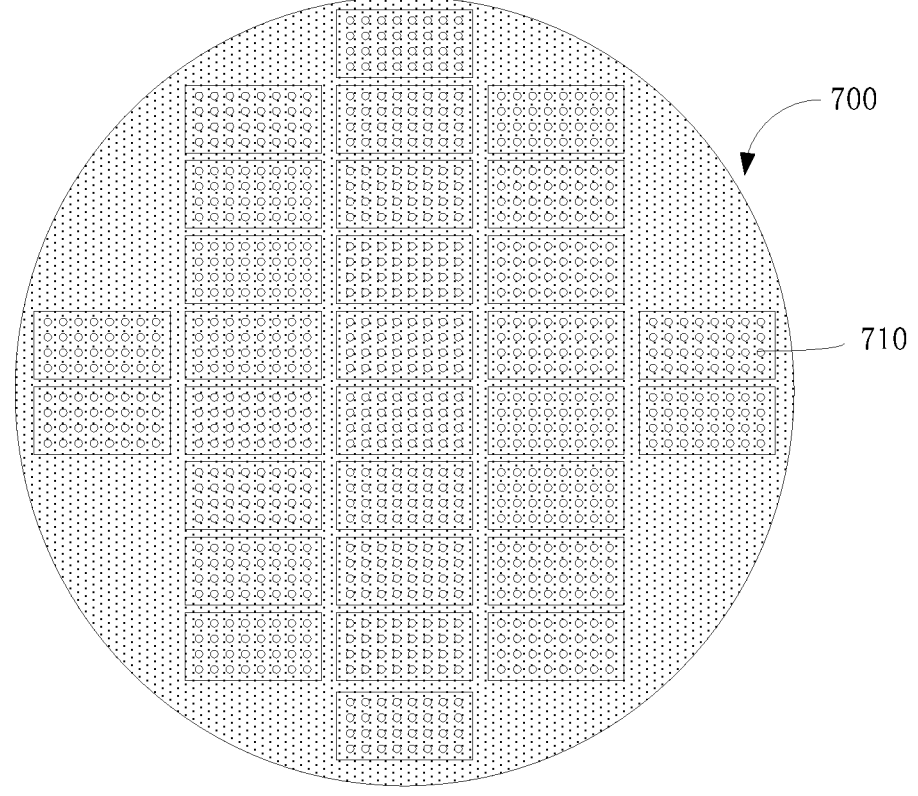
FIG. 7 is a structural diagram of an exemplary micro LED chip according to some embodiments of the present disclosure.

FIG. 7 is a structural diagram showing a plan view of an exemplary micro LED chip 700 according to some embodiments of the present disclosure. As shown in FIG. 7, the micro LED chip 700 includes one or more micro LED display panels 710 each having a structure of the micro LED panel described above with reference to FIGS. 4 to 6.

It is noted that the number of micro LEDs 410 in the micro LED panel 400 in FIG. 4, and the number of micro LED panels 710 shown in FIG. 7 are only for illustrative purpose. The number of micro LEDs in a micro LED panel and the number of micro LED panels in a micro LED chip can be varied in practice.

In some embodiments, the light emitting layer is formed by a quantum well layer. A thickness of the quantum well layer (i.e., the light emitting layer) is less than a thickness of the first type semiconductor layer. A thickness of the first electrode is larger than the thickness of the quantum well layer of the light emitting layer, and a thickness of the second electrode is larger than the thickness of the quantum well layer of the light emitting layer. A thickness of the second type semiconductor layer is larger than the twice thickness of the first type semiconductor layer.

The micro LED chip provided in the present disclosure can prevent carriers spreading between adjacent micro LEDs and forming a continual quantum well effect at the sidewall of the quantum well, to thereby minimize surface carrier nonradiative recombination. Furthermore, an isolation structure formed between the adjacent LEDs can inhibit optical and electrical crosstalk. Additionally, the minimum width of the first electrode is less than the minimum width of the first type semiconductor layer, thereby decreasing a carrier spreading area.

The embodiments may further be described using the following clauses:

1. A micro LED, comprising:
   a first type semiconductor layer;
   a light emitting layer formed on the first type semiconductor layer; and
   a second type semiconductor layer formed on the light emitting layer; wherein at least one part of a sidewall of the second type semiconductor layer is not aligned with a sidewall of the first type semiconductor layer.

2. The micro LED according to clause 1, wherein a maximum width of the second type semiconductor layer is less than a minimum width of the first type semiconductor layer.

3. The micro LED according to clause 2, wherein the sidewall of the second type semiconductor layer conforms to a straight line.

4. The micro LED according to clause 2, wherein the sidewall of the second type semiconductor layer does not conform to a straight line.

5. The micro LED according to clause 4, wherein the sidewall of the second type semiconductor layer has one or more steps.

6. The micro LED according to any one of clauses 1 to 5, wherein the sidewall of the first type semiconductor layer is aligned with a sidewall of the light emitting layer.

7. The micro LED according to any one of clauses 1 to 6, further comprising:
   a first electrode formed at a bottom of the first type semiconductor layer; and
   a second electrode formed at a top of the second type semiconductor layer.

8. The micro LED according to clause 7, wherein a maximum width of the first electrode is less than a minimum width of the first type semiconductor layer.

9. The micro LED according to clause 8, wherein the maximum width of the first electrode is less than or equal to a minimum width of the second electrode.

10. The micro LED according to any one of clauses 7 to 9, wherein a maximum width of the second electrode is less than a bottom width of the second type semiconductor.

11. A micro LED panel comprising two or more micro LEDs according to any one of clauses 1 to 10, wherein the light emitting layer is continuous between adjacent micro LEDs.

12. The micro LED panel according to clause 11, wherein the light emitting layer is formed by a quantum well layer.

13. The micro LED panel according to clause 11 or 12, further comprising an isolation structure between the adjacent micro LEDs.

14. The micro LED panel according to any one of clauses 11 to 13, wherein the first type semiconductor layer is continuous between the adjacent micro LEDs.

15. The micro LED panel according to any one of clauses 11 to 13, wherein the first type semiconductor layer is not continuous between the adjacent micro LEDs.

16. A micro LED chip comprising one or more micro LED panels according to any one of clauses 10 to 15.

It should be noted that, the relational terms herein such as "first" and "second" are used only to differentiate an entity or operation from another entity or operation, and do not require or imply any actual relationship or sequence between these entities or operations. Moreover, the words "comprising," "having," "containing," and "including," and other similar forms are intended to be equivalent in meaning and be open ended in that an item or items following any one of these words is not meant to be an exhaustive listing of such item or items, or meant to be limited to only the listed item or items.

As used herein, unless specifically stated otherwise, the term "or" encompasses all possible combinations, except where infeasible. For example, if it is stated that a database may include A or B, then, unless specifically stated otherwise or infeasible, the database may include A, or B, or A and B. As a second example, if it is stated that a database may include A, B, or C, then, unless specifically stated otherwise or infeasible, the database may include A, or B, or C, or A and B, or A and C, or B and C, or A and B and C.

In the foregoing specification, embodiments have been described with reference to numerous specific details that can vary from implementation to implementation. Certain adaptations and modifications of the described embodiments can be made. Other embodiments can be apparent to those skilled in the art from consideration of the specification and practice of the invention disclosed herein. It is intended that the specification and examples be considered as exemplary only, with a true scope and spirit of the invention being indicated by the following claims. It is also intended that the sequence of steps shown in figures are only for illustrative purposes and are not intended to be limited to any particular sequence of steps. As such, those skilled in the art can appreciate that these steps can be performed in a different order while implementing the same method.

In the drawings and specification, there have been disclosed exemplary embodiments. However, many variations and modifications can be made to these embodiments. Accordingly, although specific terms are employed, they are used in a generic and descriptive sense only and not for purposes of limitation.

What is claimed is:

1. A micro LED, comprising:
a first type semiconductor layer;
a light emitting layer formed on the first type semiconductor layer; and
a second type semiconductor layer formed on the light emitting layer; wherein a maximum width of the second type semiconductor layer is less than a minimum width of the first type semiconductor layer; at least one part of a sidewall of the second type semiconductor layer is not aligned with a sidewall of the first type semiconductor layer, and the sidewall of the second type semiconductor layer conforms to a straight line.

2. The micro LED according to claim 1, wherein the sidewall of the first type semiconductor layer is aligned with a sidewall of the light emitting layer.

3. The micro LED according to claim 1, further comprising:
a first electrode formed at a bottom of the first type semiconductor layer; and a second electrode formed at a top of the second type semiconductor layer.

4. The micro LED according to claim 3, wherein a maximum width of the first electrode is less than a minimum width of the first type semiconductor layer.

5. The micro LED according to claim 4, wherein the maximum width of the first electrode is less than or equal to a minimum width of the second electrode.

6. The micro LED according to claim 3, wherein a maximum width of the second electrode is less than a bottom width of the second type semiconductor.

7. A micro LED panel comprising two or more micro LEDs, wherein each one of the two or more micro LEDs comprises:
a first type semiconductor layer;
a light emitting layer formed on the first type semiconductor layer; and
a second type semiconductor layer formed on the light emitting layer; wherein at least one part of a sidewall of the second type semiconductor layer is not aligned with a sidewall of the first type semiconductor layer;
wherein the light emitting layer is continuous between adjacent ones of the two or more micro LEDs.

8. The micro LED panel according to claim 7, wherein the light emitting layer is formed by a quantum well layer.

9. The micro LED panel according to claim 7, further comprising an isolation structure between the adjacent ones of the two or more micro LEDs.

10. The micro LED panel according to any one of claim 7, wherein the first type semiconductor layer is continuous between the adjacent ones of the two or more micro LEDs.

11. The micro LED panel according to any one of claim 7, wherein the first type semiconductor layer is not continuous between the adjacent ones of the two or more micro LEDs.

12. A micro LED chip comprising one or more micro LED panels, wherein each one of the one or more micro LED panels comprises two or more micro LEDs, and each one of the two or more micro LEDs comprises:
a first type semiconductor layer;
a light emitting layer formed on the first type semiconductor layer; and
a second type semiconductor layer formed on the light emitting layer; wherein at least one part of a sidewall of the second type semiconductor layer is not aligned with a sidewall of the first type semiconductor layer;
wherein the light emitting layer is continuous between adjacent ones of the two or more micro LEDs.

* * * * *